United States Patent
Kuroki

(10) Patent No.: US 6,919,754 B2
(45) Date of Patent: Jul. 19, 2005

(54) FUSE DETECTION CIRCUIT

(75) Inventor: Koji Kuroki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/779,734

(22) Filed: Feb. 18, 2004

(65) Prior Publication Data

US 2004/0227562 A1 Nov. 18, 2004

(30) Foreign Application Priority Data

May 14, 2003 (JP) .......................... 2003-135600

(51) Int. Cl.[7] .................. H03K 17/20; H03K 17/18
(52) U.S. Cl. ............................. 327/525; 365/225.7
(58) Field of Search ............................ 327/525, 55, 57; 365/96, 205, 225.7

(56) References Cited

U.S. PATENT DOCUMENTS 6,498,526 B2 * 12/2002 Lim et al. .................. 327/525
6,842,367 B2 * 1/2005 Hidaka ..................... 365/173

FOREIGN PATENT DOCUMENTS

JP 10-062477 3/1998
JP 2001-13224 1/2001

* cited by examiner

*Primary Examiner*—Timothy P. Callahan
*Assistant Examiner*—Terry L. Englund
(74) *Attorney, Agent, or Firm*—Nixon Peabody LLP; Donald R. Studebaker

(57) ABSTRACT

There is provided a fuse detection circuit comprising a first inverter circuit comprising a PMOS transistor (P2) and an NMOS transistor (N2) having gates connected in common and connected to the first node (A); a second inverter circuit comprising a PMOS transistor (P1) and an NMOS transistor (N1) having gates connected in common and connected to the second node (B); and a third NMOS transistor (N3) having a drain and source connected between the third node (C) and the ground potential, and a gate connected with the control signal, wherein the control signal is set to a predetermined level in an initial state to precharge the node (A),(B) and thereafter a molten state of a fuse is detected in accordance with a potential level of the second node (B) at a change in the level of the control signal.

6 Claims, 2 Drawing Sheets

FUSE DETECTION CIRCUIT

BACKGROUND OF THE INVENTION

1. Field of the Invention

The present invention relates to a semiconductor device, and particularly to a fuse detection circuit.

2. Description of the Related Art

In general, a method of, using a fuse composed of a conductor, storing the status of the fuse according to whether it is cut out by laser, and reading its stored status by a detection circuit, has been used for a fuse detection circuit. The dimensions of the fuse are determined according to the accuracy of a laser device. There is a tendency to allow the fuse to assume a 10% cuttable setting (field-proven dimensions) with a view toward realizing stable high yields.

However, the aforementioned dimension determining method has a problem that the capability of the laser device has not been drawn Up to 100%. Since there may be a case wherein when the dimensions are set in accordance with the capability of the laser device, only some of the fuse is blown due to variations in process, the conventional detection circuit is accompanied by a problem that both the opening and short-circuiting of the fuse are not detected so that a logic output becomes indefinite, thus causing a malfunction.

SUMMARY OF THE INVENTION

A fuse detection circuit is provided which does not malfunction. According to a first aspect of the present invention, there is provided a fuse detection circuit comprising a first PMOS transistor (P3) having a source and drain connected between a power supply potential and a first node (A), and a gate connected with a control signal; a fuse mounting section having one terminal a connected to the first node (A) and the other end b connected to a drain of a first NMOS transistor (N4); the first NMOS transistor (N4) having the drain and a source connected between the other end b and a ground potential, and a gate connected with the control signal; a second PMOS transistor (P4) having a source and drain connected between the power supply potential and a second node (B), and a gate connected with the control signal; a reference resistance having one end connected to the second node (B) and the other end connected to a drain of a second NMOS transistor (N5); the second NMOS transistor (N5) having the drain and a source connected between the other end of the reference resistance and the ground potential and a gate connected with the control signal; a first inverter circuit comprising a PMOS transistor (P2) and an NMOS transistor (N2) connected in series between the power supply potential and a third node (C) and having gates connected in common and connected to the first node; a second inverter circuit comprising a PMOS transistor (P1) and an NMOS transistor (N1) connected in series between the power supply potential and the third node (C) and having gates connected in common and connected to the second node; and a third NMOS transistor (N3) having a drain and source connected between the third node (C) and the ground potential, and a gate connected with the control signal, wherein the control signal is set to a predetermined level in an initial state to precharge the first and second nodes, and thereafter a molten state of a fuse mounted to the fuse mounting section is detected in accordance with a potential level of the second node (B) at a change in the level of the control signal.

According to such a circuit configuration, even when only some of the fuse has been blown, the cutting out of the fuse can be judged by making a comparison of the presence or absence of the fuse cutout with the reference resistance. Accordingly, it is possible to use fuse dimensions in the vicinity of the limit capability of a laser device and thereby reduce the area of the fuse.

According to a second aspect of the present invention, there is provided a fuse detection circuit wherein an NMOS transistor (N6) and an NMOS transistor (N7) are further provided between the terminal b of the fuse mounting section and the first NMOS transistor (N4) and between the other end of the reference resistance and the second NMOS transistor respectively, and gate potentials of these transistors N6 and N7 are controlled based on potentials of the nodes A and B.

According to the circuit having such a configuration, since the transistors N6 and N7 are turned off after the fuse has been judged to be blown, through currents at a resistive element section and a non-cutout fuse section can be avoided.

Further, according to a third aspect of the present invention, there is provided a fuse detection circuit comprising a first PMOS transistor (P3) having a source and drain connected between a power supply potential and a first node (A), and a gate connected with a control signal; a second PMOS transistor (P4) having a source and drain connected between the power supply potential and a second node (B), and a gate connected with the control signal; a first inverter circuit comprising a PMOS transistor (P1) and an NMOS transistor (N1) connected in series between the power supply potential and a third node (C) and having gates connected in common and connected to the second node (B); a second inverter circuit comprising a PMOS transistor (P2) and an NMOS transistor (N2) connected in series between the power supply potential and a fourth node (D) and having gates connected in common and connected to the first node (A); a fuse mounting section having one terminal a connected to the third node (C) and the other end b connected to a fifth node (E); a reference resistance having one end connected to the fourth node (D) and the other end connected to the fifth node (E); and a first NMOS transistor (N3) having a drain and source connected between the fifth node (E) and a ground potential, and a gate connected with the control signal, wherein the control signal is set to a predetermined level in an initial state to thereby precharge the first and second nodes, and thereafter a molten state of a fuse mounted to the fuse mounting section is detected in accordance with a potential level of the second node (B) at a change in the level of the control signal.

According to such a circuit configuration, an effect can be obtained that the present fuse detection circuit normally operates even when, for example, a power supply voltage VCC is a low voltage such as 1.0V. Also an effect can be obtained that since the present fuse detection circuit can be composed of a small number of elements, a layout area can be reduced.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Preferred embodiments of the present invention will hereinafter be described in detail with reference to the accompanying drawings.

First Embodiment

Figure 1:
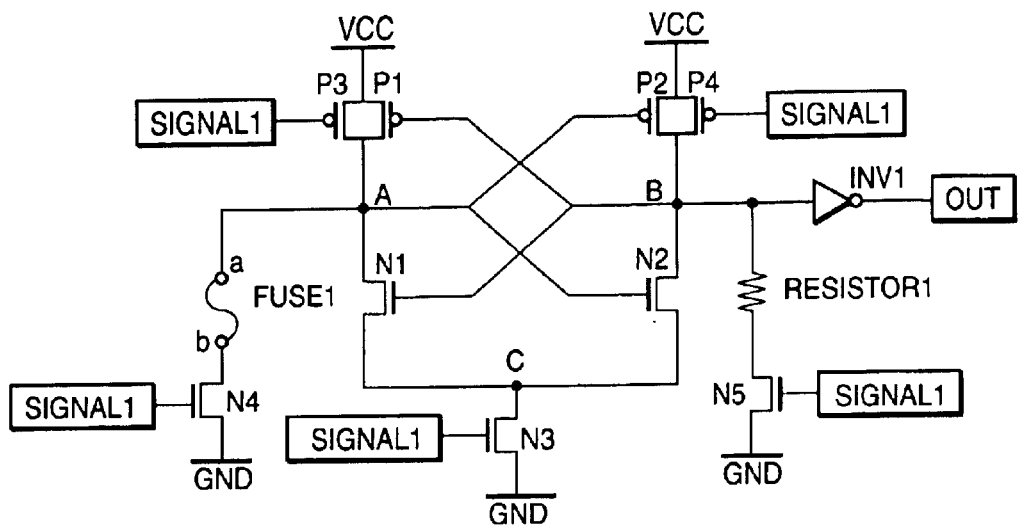
FIG. 1 is a circuit diagram showing a first embodiment of the present invention.

FIG. 1 is a circuit diagram of a fuse detection circuit showing a first embodiment of the present invention. The fuse detection circuit comprises a fuse element (fuse 1), a resistive element (resistor 1) used as the reference, PMOS transistors (P1 through P4), NMOS transistors (N1 through N5), and a CMOS inverter (INV1).

One terminal b of the fuse 1 is connected to the drain of the transistor N4, and the other terminal a of the fuse 1 is connected to the drain of the transistor N1, the drain of the transistor P1, and the drain of the transistor P3, i.e., a node A.

The source of the transistor N4 is connected to a reference potential (e.g., ground potential) GND, the source of the transistor N1 is connected to the drain (node C) of the transistor N3, the sources of the transistors P1 and P3 are respectively connected to a power supply voltage VCC, and the source of the transistor N3 is connected to the reference potential GND.

One terminal of the resistor 1 is connected to the drain of the transistor N5, and the other terminal of the resistor 1 is connected to the drain of the transistor N2, the drain of the transistor P2 and the drain of the transistor P4, i.e., a node B, and connected even to the gate of the signal output inverter INV1.

The source of the transistor N5 is connected to the reference potential GND, the source of the transistor N2 is connected to the drain of the transistor N3, and the sources of the transistors P2 and P4 are respectively connected to the power supply voltage VCC.

The gates of the transistors N1 and P1 are connected in common to the node B, and the gates of the transistors N2 and P2 are connected in common to the node A. The transistors N1 and P1 constitute an inverter circuit (second inverter circuit), and the transistors N2 and P2 also constitute an inverter circuit (first inverter circuit). The gates of the transistors P3 and P4 and the transistors N3, N4 and N5 are connected to a signal 1.

Further, the gate of the INV1 is connected to the node B so that an output signal OUT is outputted. A resistance value or higher at the non-cutout of the fuse 1 is used as the resistance value of the resistor 1.

When the potential level of the output OUT is an "L" level (e.g., ground potential), the fuse is defined as having been judged not to be cut out, whereas when the potential level thereof is an "H" level (e.g., source potential), the fuse is defined as-having been judged to be cut out.

In an initialized state, i.e., when the potential level of the signal 1 is an L" level, the transistors P3 and P4 are turned on and the transistors N3, N4 and N5 are turned off. At this time, the input level of the CMOS inverter INV1 reaches an H" level and the output level of the inverter INV1 reaches an "L" level. Thus, the fuse has been set as a non-cutout upon initialization.

Next, when the potential level of the signal 1 makes an "L" to "H" level transition, the transistors P3 and P4 are turned off and the transistors N3, N4 and N5 are turned on so that the status of the fuse is determined. When the fuse 1 is being cut out, the relation of (the resistance of the fuse 1 section)>(the resistance of the resistor 1) is established. Thus, since the potential of the node A, which is indicative of the input of the first inverter circuit, becomes an "H" level, and the potential of the node B, which is indicative of the output thereof, becomes an "L" level, the gate potential level of the inverter INV1 is transitioned from the "H" level to the "L" level, and the output OUT thereof makes an "L" to "H" level transition, so that the, fuse 1 is judged to have been cut out.

On the other hand, when the fuse 1 is in a non-cutout state, the relation of (the resistance of the fuse 1 section)>(the resistance of the resistor 1) is established. Thus, since the potential of the node A, which is indicative of the input of the first inverter circuit, becomes an "L" level, and the potential of the node B, which is indicative of the output thereof, becomes an "H" level, the input level of the inverter INV1 is maintained at the "H" level and the output level thereof reaches an "L" level, so that the fuse 1 is judged not to have been cut out.

According to the first embodiment as described above, even when only some of the fuse has blown, the cutting out of the fuse can be determined by making a comparison of the presence or absence of the fuse cutout and the reference resistance. Accordingly, the present embodiment brings about the effect of being able to use fuse dimensions in the vicinity of the limit capability of a laser device and reduce the area of the fuse.

Second Embodiment

Figure 2:
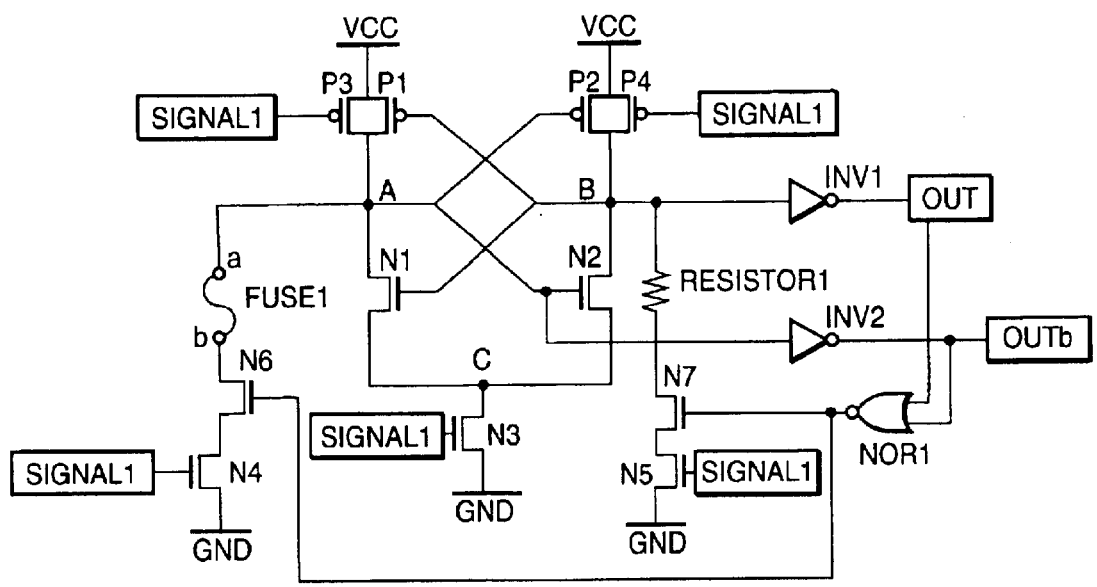
FIG. 2 is a circuit diagram illustrating a second embodiment of the present invention.

FIG. 2 is a circuit diagram showing a second embodiment of the present invention. The present embodiment comprises a fuse element (fuse 1), a resistive element (resistor 1) used as the reference, PMOS transistors (P1 through P4), NMOS transistors (N1 through N7), CMOS inverters (INV1 and INV2), and a CMOS NOR gate (NOR1).

One terminal b of the fuse 1 is connected to the drain of the transistor N6, and the other terminal a of the fuse 1 is connected to the drain of the transistor N1, the drain of the transistor P1, and the drain of the transistor P3, i.e., a node A.

The source of the transistor N6 is connected to the drain of the transistor N4, the source of which is connected to a reference potential GND. The source of the transistor N1 is connected to the drain (node C) of the transistor N3, the sources of the transistors P1 and P3 are respectively connected to a power supply voltage VCC, and the source of the transistor N3 is connected to the reference potential GND.

One terminal of the resistor 1 is connected to the drain of the transistor N7, and the other-terminal of the resistor 1 is connected to the drain of the transistor N2 and the drains of the transistors P2 and P4, i.e., a node B.

The source of the transistor N7 is connected to the drain of the transistor N5, and the source of the transistor N5 is connected to the reference potential GND. The source of the transistor N2 is connected to the drain (node C) of the transistor N3, and the sources of the transistors P2 and P4 are respectively connected to the power supply voltage VCC.

The gates of the transistors N1 and P1 are connected to the node B, and the gates of the transistors N2 and P2 are connected to the node A. The transistors N1 and P1 constitute an inverter circuit (second inverter circuit), and the transistors N2 and P2 constitute an inverter circuit (first inverter circuit). The gates of the transistors P3 and P4 and the transistors N3, N4 and N5 are respectively connected to a signal 1.

Further, the node B is connected to the gate of the inverter INV1, from a terminal OUT of which an output signal is taken out. The node A is connected to the gate of the inverter INV2, from an output terminal OUTb of which an output signal is taken out.

The outputs OUT/OUTb of the inverters INV1 and INV2 are respectively connected to the two inputs of the CMOS NOR gate NOR1. The output of the NOR gate NOR1 is connected to the gates of the transistors N6 and N7. A resistance value or higher at the non-cutout of the fuse 1 is used as the resistance value of the resistor 1.

Let's first consider that when the level of the output OUT is an "L" level (e.g., ground potential), the fuse is judged not to be cut out, whereas when the level thereof is an "H" level (e.g., external source potential), the fuse is judged to be cut out. In an initial state, i.e., when the level of the signal 1 is an L" level, the transistors P3 and P4 are turned on and the transistors N3, N4 and N5 are turned off. At this time, the gate levels of the CMOS inverters INV1 and INV2 both reach an H" level and the levels of their outputs OUT and OUTb both reach an "L" level. Thus, the output level of the NOR gate becomes an "H" level, so the transistors N6 and N7 are respectively brought to an on state.

Next, when the level of the signal 1 makes an "L" to "H" level transition, the transistors P3 and P4 are turned off and the transistors N3, N4 and N5 are turned on so that the status of the fuse is determined.

When the fuse 1 is being cut out, the relation of (the resistance of the fuse 1 section)>(the resistance of the resistor 1) is established. Thus, since the potential of the node A, which is indicative of the input of the first inverter circuit, becomes an "H" level, and the potential of the node B, which is indicative of the output thereof, becomes an "L" level, the gate level of the inverter INV1 is transitioned from the "H" level to the "L" level, and the level of the output OUT thereof is transitioned to an "H" level, so that the fuse 1 is judged to have been cut out. Since the gate level of the inverter INV2 is maintained at the "H" level, the level of the output OUTb is held at the "L" level.

On the other hand, when the fuse 1 is in a non-cutout state, the relation of (the resistance of the fuse 1 section)>(the resistance of the resistor 1) is established. Thus, since the potential of the node A, which is indicative of the input of the first inverter circuit, becomes an "L" level, and the potential of the node B, which is indicative of the output thereof, becomes an "H" level, the gate level of the inverter INV1 is maintained at the "H" level and thereby the output OUT thereof is held at the "L" level, so that the fuse 1 is judged not to have been cut out. At this time, the gate level of the inverter INV2 is transitioned to an "L" level, and the output OUTb is transitioned to an "H" level.

When the potential level of either the output OUT or the output OUTb is transitioned to the "H" level, the potential level of the output of the NOR gate NOR1 is transitioned from the "H" to "L" levels so that the transistors N6 and N7 are turned off.

While the through currents have been produced at the reference section (resistive element section) and the non-cutout fuse section in the state subsequent to the fuse judgement in the first embodiment as described above, the second embodiment obtains the effect of turning off the transistors N6 and N7 after the determination of whether the fuse has been blown, to thereby avoid the occurrence of the through currents at the resistive element section and the non-cutout fuse section.

Third Embodiment

Figure 3:
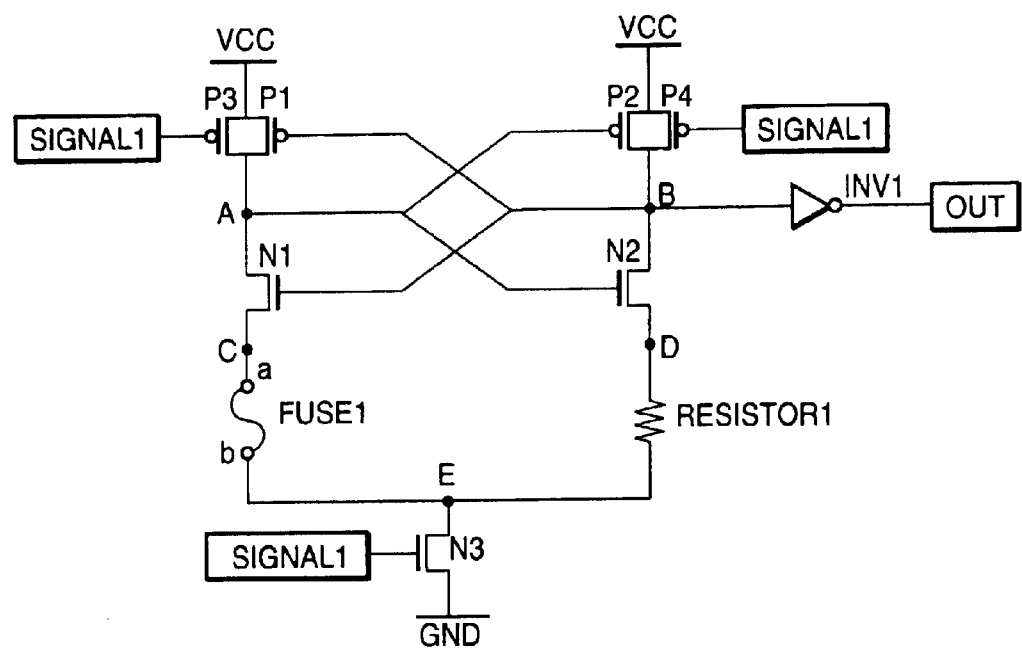
FIG. 3 is a circuit diagram depicting a third embodiment of the present invention.

FIG. 3 is a circuit diagram showing a third embodiment of the present invention, which comprises a fuse element (fuse 1), a resistive element (resistor 1) used as the reference, PMOS transistors (P1 through P4), NMOS transistors (N1 through N3), and a CMOS inverter (INV1).

One terminal a of the fuse 1 is connected to the source (node C) of the transistor N1, and the other terminal b of the fuse 1 is connected to the drain (node E) of the transistor N3. The drain of the transistor N1 is connected to the drains of the transistors P1 and P3, i.e., a node A, the source of the transistor N3 is connected to a reference potential GND, and the sources of the transistors P1 and P3 are connected to a power supply voltage VCC.

One terminal of the resistor 1 is connected to the source (node D) of the transistor N2, and the other terminal of the resistor 1 is connected to the node E. The drain of the transistor N2 is connected to the drains of the transistors P2 and P4, i.e., a node B, and the sources of the transistors P2 and P4 are connected to the power supply voltage VCC.

The gates of the transistors N1 and P1 are connected to the node B so as to constitute a first inverter circuit, and the gates of the transistors N2 and P2 are connected to the node A so as to constitute a second inverter circuit. The gates of the transistors P3, P4 and N3 are connected to a signal 1.

Further, the node B is connected to the gate of the inverter INV1, and the output thereof is connected to an output terminal OUT. A resistance value or higher at the non-cutout of the fuse 1 is used as the resistance value of the resistor 1.

Assuming first that when the potential level of the output OUT is an "L" level (e.g., ground potential), the fuse is judged not to be cut out, whereas when the potential level thereof is an "H" level (e.g., external source potential), the fuse is judged to be cut out. In an initialized state, i.e., when the potential level of the signal 1 is an L" level, the transistors P3 and P4 are turned on and the transistor N3 is turned off. In such a state, the gate potential level of the inverter INV1 is brought to an "H" level, and the output OUT of the inverter INV1 is brought to an "L" level. Thus, the fuse has been set to a fuse non-cutout upon initialization.

Next, when the potential level of the signal 1 is transitioned to an "H" level, the transistors P3 and P4 are turned off and the transistor N3 is turned on so that the status of the fuse is determined.

When the fuse 1 is being cut out, the relation of (the resistance of the fuse 1 section)>(the resistance of the resistor 1) is established. Thus, since the potential of the node A, which is indicative of the input of the second inverter circuit, becomes an "H" level, and the potential of the node B, which is indicative of the output thereof, becomes an "L" level, the gate potential level of the inverter INV1 is transitioned to an "L" level, and the potential level of the output OUT thereof is transitioned to an "H" level, so that the fuse 1 is judged to have been cut out.

On the other hand, when the fuse 1 is in a non-cutout state, the relation of (the resistance of the fuse 1 section)<(the resistance of the resistor 1) is established. Thus, since the potential of the node A, which is indicative of the input of the second inverter circuit, becomes an "L" level, and the potential of the node B, which is indicative of the output thereof, becomes an "H" level, the gate potential level of the inverter INV1 is maintained at the "H" level and the potential level of the output OUT is held at the "L" level, so that the fuse 1 is judged not to have been cut out.

In the first or second embodiment, when the power supply voltage VCC is of a low voltage such as 1.0V, for example, the speed of response of an amplifier employed in a determination circuit is reduced and the respective electrical charges at the nodes A and B are discharged through the resistive element or resistor 1 and the non-cutout fuse 1 so that the difference in potential between the nodes A and B becomes small, thus taking time to make a decision as to the fuse. It is therefore not possible to determine whether or not the fuse is normal, within the time defined in a power-on sequence. However, such a problem as mentioned above can be avoided by integrating such amplifier, fuse and reference sections as in the third embodiment. Thus, an effect is obtained that the fuse detection circuit normally operates even when the power supply voltage VCC is a low voltage such as 1.0V, for example.

Fourth Embodiment

In a fourth embodiment, each of the reference resistances (resistors 1) of the fuse determination circuits according to the first through third embodiments is set to more than or equal to twice the resistance of the non-cutout fuse section. The present embodiment is similar in other configuration to the first through third embodiments.

In order to operate a comparator with efficiency, the comparator is first operated stably and at high speed as the difference between values to be compared increases from a reference value (reference resistance). It is needless to say that if the reference resistance (resistor 1) of the fuse determination circuit is set equal to the resistance of the non-cutout fuse section, then the comparator does not operate normally in the case of a fuse non-cutout. Although depending on the performance of each transistor, a stable comparator can be realized by setting the reference resistance (resistor 1) of the fuse determination circuit to more than or equal to twice the resistance of the non-cutout fuse section. The present embodiment is similar in other operations to the first through third embodiments.

In addition to an effect that it is possible to stably make a decision as to whether the fuse has been cut out, the present embodiment can obtain an effect that a reduction in the response speed of the fuse determination circuit can be suppressed at a low voltage in particular.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A fuse detection circuit comprising:
   a first PMOS transistor (P3) having a source and drain connected between a power supply potential and a first node, and a gate connected with a control signal;
   a fuse mounting section having one end a connected to the first node and the other end b connected to a drain of a first NMOS transistor (N4);
   said first NMOS transistor (N4) having the drain and a source connected between the other end b and a ground potential, and a gate connected with the control signal;
   a second PMOS transistor (P4) having a source and drain connected between the power supply potential and a second node, and a gate connected with the control signal;
   a reference resistance having one end connected to the second node and the other end connected to a drain of a second NMOS transistor (N5);
   said second NMOS transistor (N5) having the drain and a source connected between the other end of said reference resistance and the ground potential, and a gate connected with the control signal;
   a first inverter circuit comprising a PMOS transistor (P2) and an NMOS transistor (N2) connected in series between the power supply potential and a third node and having gates connected in common and connected to the first node;
   a second inverter circuit comprising a PMOS transistor (P1) and an NMOS transistor (N1) connected in series between the power supply potential and the third node and having gates connected in common and connected to the second node; and
   a third NMOS transistor (N3) having a drain and source connected between the third node and the ground potential, and a gate connected with the control signal,
   wherein the control signal is set to a predetermined level in an initial state to precharge the first and second nodes, and thereafter a molten state of a fuse mounted to said fuse mounting section is detected in accordance with a potential level of the second node at a change in the level of the control signal, and an output of the first inverter circuit is coupled to the second node, and an output of the second inverter circuit is coupled to the first node.

2. The fuse detection circuit according to claim 1, wherein an NMOS transistor (N6) and an NMOS transistor (N7) are further provided between the end b of said fuse mounting section and the first NMOS transistor (N4) and between the other end of said reference resistance and the second NMOS transistor (N5) respectively, and gate potentials of these transistors N6 and N7 are controlled based on potentials of the first and second nodes.

3. The fuse detection circuit according to claim 1, wherein the resistance value of the reference resistance is set to more than or equal to twice the resistance value of the fuse mounted to the fuse mounting section at its non-cutout state.

4. The fuse detection circuit according to claim 2, wherein the resistance value of the reference resistance is set to more than or equal to twice the resistance value of the fuse mounted to the fuse mounting section at its non-cutout state.

5. A fuse-detection circuit comprising:
- a first PMOS transistor (P3) having a source and drain connected between a power supply potential and a first node, and a gate connected with a control signal;
- a second PMOS transistor (P4) having a source and drain connected between the power supply potential and a second node, and a gate connected with the control signal;
- a first inverter circuit comprising a PMOS transistor (P1) and an NMOS transistor (N1) connected in series between the power supply potential and a third node and having gates connected in common and connected to the second node;
- a second inverter circuit comprising a PMOS transistor (P2) and an NMOS transistor (N2) connected in series between the power supply potential and a fourth node and having gates connected in common and connected to the first node;
- a fuse mounting section having one end a connected to the third node and the other end b connected to a fifth node;
- a reference resistance having one end connected to the fourth node and the other end connected to the fifth node; and
- a first NMOS transistor (N3) having a drain and source connected between the fifth node and a ground potential, and a gate connected with the control signal, wherein the control signal is set to a predetermined level in an initial state to thereby precharge the first and second nodes, and thereafter a molten state of a fuse mounted to said fuse mounting section is detected in accordance with a potential level of the second node at a change in the level of the control signal, and an output of the first inverter circuit is coupled to the first node, and an output of the second inverter circuit is coupled to the second node.

6. The fuse detection circuit according to claim 3, wherein the resistance value of the reference resistance is set to more than or equal to twice the resistance value of the fuse mounted to the fuse mounting section at its non-cutout state.

* * * * *